United States Patent
Daubenspeck et al.

(10) Patent No.: US 9,159,696 B2
(45) Date of Patent: Oct. 13, 2015

(54) PLUG VIA FORMATION BY PATTERNED PLATING AND POLISHING

(71) Applicant: International Business Machines Corporation, Armonk, NY (US)

(72) Inventors: Timothy H. Daubenspeck, Colchester, VT (US); Jeffrey P. Gambino, Westford, VT (US); Ekta Misra, Fishkill, NY (US); Christopher D. Muzzy, Burlington, VT (US); Wolfgang Sauter, Richmond, VT (US)

(73) Assignee: GLOBALFOUNDRIES, INC., Grand Cayman (KY)

( * ) Notice: Subject to any disclaimer, the term of this patent is extended or adjusted under 35 U.S.C. 154(b) by 0 days.

(21) Appl. No.: 14/026,158

(22) Filed: Sep. 13, 2013

(65) Prior Publication Data
US 2015/0076688 A1    Mar. 19, 2015

(51) Int. Cl.
*H01L 21/44*    (2006.01)
*H01L 23/00*    (2006.01)

(52) U.S. Cl.
CPC ............ *H01L 24/81* (2013.01); *H01L 24/11* (2013.01)

(58) Field of Classification Search
CPC ......... H01L 24/03; H01L 24/05; H01L 24/11; H01L 24/12; H01L 24/13; H01L 24/81; H01L 21/11
USPC ......................................................... 438/613
See application file for complete search history.

(56) References Cited

U.S. PATENT DOCUMENTS

| | | | |
|---|---|---|---|
| 5,578,523 A * | 11/1996 | Fiordalice et al. | 438/633 |
| 6,121,150 A | 9/2000 | Avanzino et al. | |
| 6,346,741 B1 | 2/2002 | Van Buskirk et al. | |
| 6,559,048 B1 * | 5/2003 | Kim et al. | 438/637 |
| 6,815,336 B1 | 11/2004 | Shue et al. | |
| 7,091,600 B2 | 8/2006 | Liu et al. | |
| 7,211,512 B1 | 5/2007 | Ahn et al. | |
| 7,262,505 B2 | 8/2007 | Ahn et al. | |
| 7,311,862 B2 | 12/2007 | Prasad | |
| 7,485,564 B2 * | 2/2009 | Daubenspeck et al. | 438/613 |
| 7,494,912 B2 * | 2/2009 | Coolbaugh et al. | 438/612 |
| 7,541,272 B2 * | 6/2009 | Daubenspeck et al. | 438/612 |
| 7,682,965 B2 | 3/2010 | Kim et al. | |
| 2006/0017160 A1 * | 1/2006 | Huang | 257/737 |
| 2007/0134911 A1 | 6/2007 | Kang | |

FOREIGN PATENT DOCUMENTS

| | | |
|---|---|---|
| EP | 1797549 A2 | 6/2007 |
| JP | 2007287731 A | 11/2007 |
| KR | 100538634 B1 | 12/2005 |

* cited by examiner

*Primary Examiner* — Stephen W Smoot
*Assistant Examiner* — Vicki B Booker
(74) *Attorney, Agent, or Firm* — Thompson Hine LLP; Anthony J. Canale

(57) ABSTRACT

Solder bump connections and methods for fabricating solder bump connections. A passivation layer is formed on a dielectric layer. A via opening extends through the passivation layer from a top surface of the passivation layer to a metal line in the dielectric layer. A mask on the top surface of the passivation layer includes a mask opening that is aligned with the via opening. A conductive layer is selectively formed in the via opening and the mask opening. The conductive layer projects above the top surface of the passivation layer. The method further includes planarizing the passivation layer and the conductive layer to define a plug in the via opening that is coupled with the metal line.

20 Claims, 3 Drawing Sheets

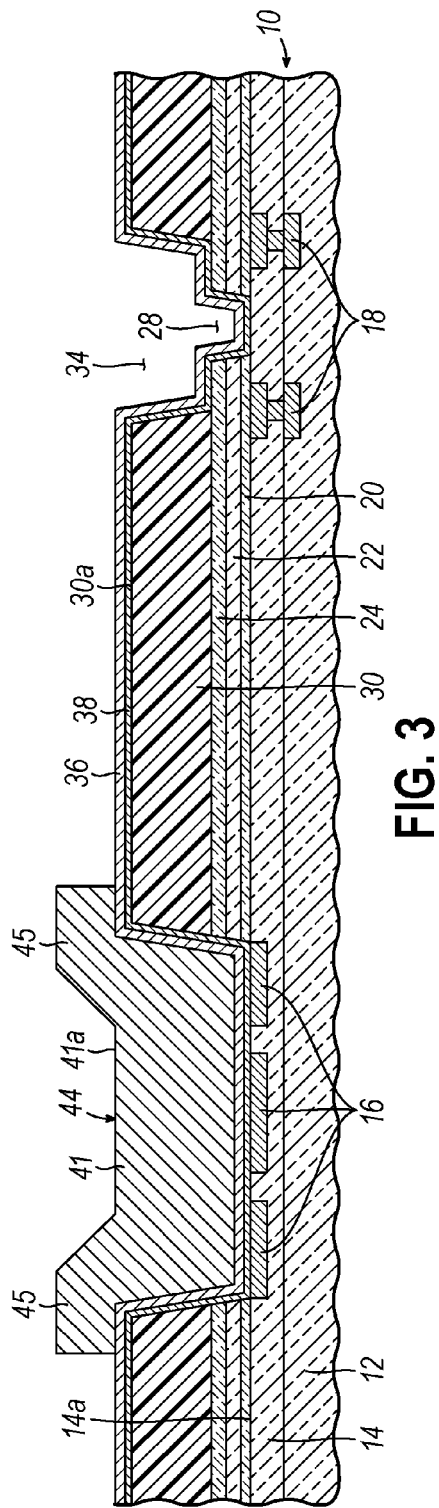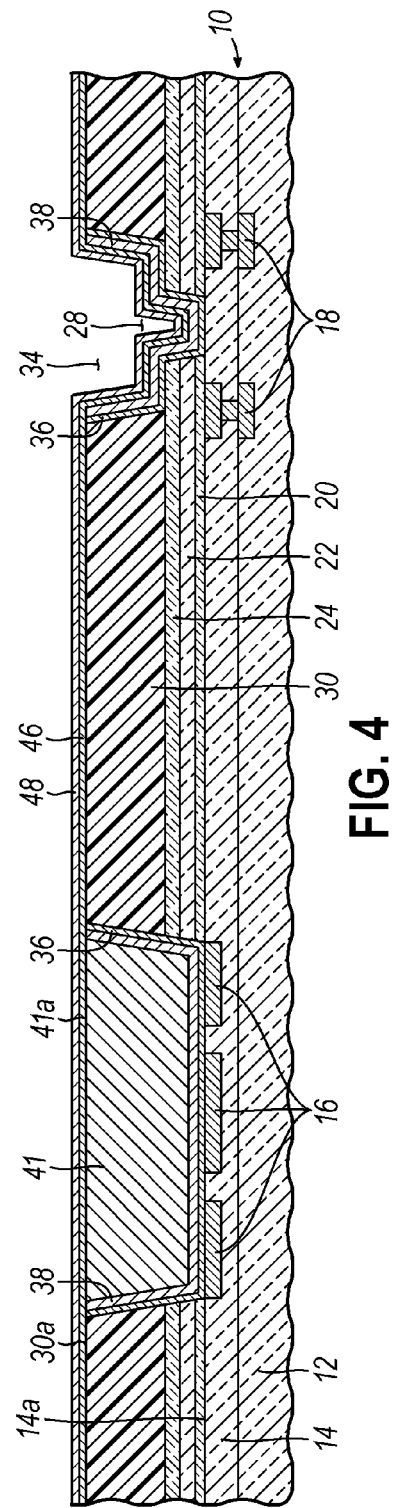

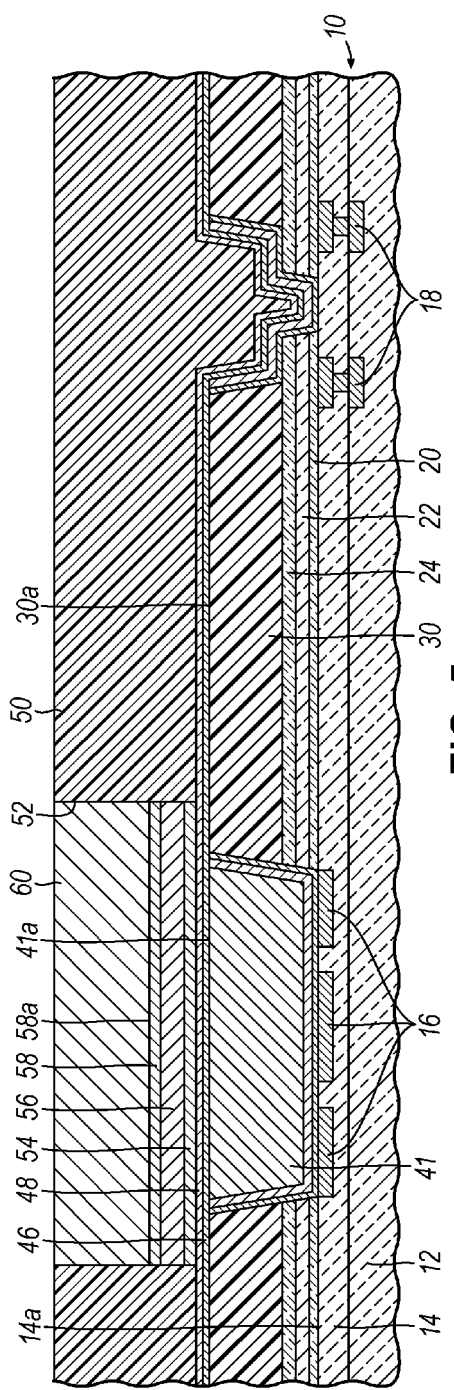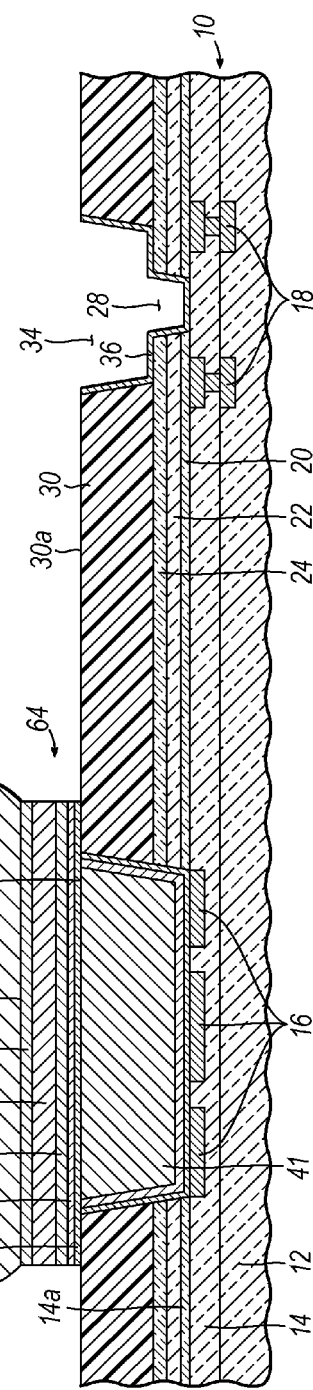

PLUG VIA FORMATION BY PATTERNED PLATING AND POLISHING

BACKGROUND

The invention relates generally to semiconductor structures and fabrication of semiconductor chips and, in particular, to solder bump connections and methods for fabricating solder bump connections during back-end-of-line processing of semiconductor chips.

A chip or die includes integrated circuits formed by front-end-of-line processing, a local interconnect layer formed by middle-end-of-line processing, and stacked metallization levels of an interconnect structure formed by back-end-of line processing. Chips may be packaged and mounted on a circuit board or other chip carrier using a controlled collapse chip connection or flip chip process. The solder bumps provide mechanical and electrical connections between features in the last or top metallization level and the circuit board. The solder bumps can be formed using any number of methods, including electroplating, evaporation, printing, and direct placement. The solder bumps establish physical attachment and electrical contact between an array of pads on the chip and a complementary array of pads on a circuit board.

Solder bump connections and fabrication methods are needed that improve on conventional solder bump connections and fabrication methods.

SUMMARY

In an embodiment of the invention, a method is provided for fabricating a solder bump connection. The method includes forming a passivation layer on a dielectric layer, forming a via opening extending through the passivation layer from a top surface of the passivation layer to a metal line in the dielectric layer, and forming a mask on the top surface of the passivation layer. A mask opening in the mask is aligned with the via opening. The method further comprising selectively forming a conductive layer in the via opening and the mask opening. The conductive layer projects above the top surface of the passivation layer. The method further includes planarizing the passivation layer and the conductive layer to define a plug in the via opening that is coupled with the metal line.

In an embodiment of the invention, a solder bump connection includes a via opening extending through a passivation layer and a plug in the via opening. The plug is comprised of a conductor, and the passivation layer includes a top surface that is coplanar with the plug and that is free of surface damage.

BRIEF DESCRIPTION OF THE SEVERAL VIEWS OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

FIGS. 1-6 are cross-sectional views of a portion of a substrate at successive stages of a processing method for fabricating a device structure in accordance with an embodiment of the invention.

DETAILED DESCRIPTION

Figure 1:
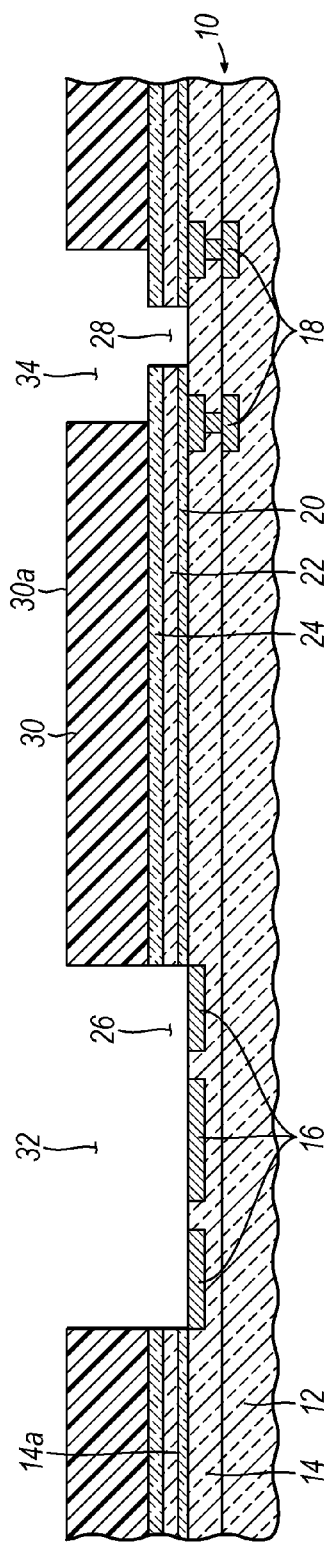

With reference to FIG. 1 and in accordance with an embodiment of the invention, a topmost metallization level of a back-end-of-line (BEOL) interconnect structure, generally indicated by reference numeral 10, includes a plurality of dielectric layers 12, 14, as well as a metal line 16 and a plurality of metal features 18 embedded as metallization in one or more of the dielectric layers 12, 14. In the representative embodiment, the metal line 16 is adjacent to the metal features 18 and the metal features 18 are near a scribe line for the substrate. Typical constructions for the BEOL interconnect structure consist of two or more individual metallization levels. The metallization levels of the BEOL interconnect structure are formed by deposition, lithography, etching, and polishing techniques characteristic of damascene processes associated with BEOL processing.

Each of the dielectric layers 12, 14 may be comprised of an organic or inorganic dielectric material that is an electrical insulator with an electrical resistivity at room temperature of greater than $10^{10}(\Omega\text{-m})$ is deposited. Candidate inorganic dielectric materials for dielectric layers 12, 14 may include, but are not limited to, silicon dioxide, fluorine-doped silicon glass (FSG), and combinations of these dielectric materials. Alternatively, the dielectric layers 12, 14 may be comprised of a low-k dielectric material characterized by a relative permittivity or dielectric constant smaller than the $SiO_2$ dielectric constant of approximately 3.9. Candidate low-k dielectric materials for dielectric layers 12, 14 include, but are not limited to, porous and nonporous spun-on organic low-k dielectrics (e.g., thermoset polymer resins), porous and non-porous inorganic low-k dielectrics (e.g., organosilicate glasses, hydrogen-enriched silicon oxycarbide (SiCOH), and carbon-doped oxides), and combinations of these and other organic and inorganic dielectrics. Dielectric layers 12, 14 may be deposited by any number of techniques including, but not limited to, sputtering, spin-on application, or CVD.

The metal line 16 and the metal features 18 may be comprised of copper, aluminum, or an alloy of these materials, and may be formed by a damascene process in the dielectric layers 12, 14. The metal line 16 may be slotted or "cheesed" to limit current crowding.

The BEOL interconnect structure is carried on a die or chip that has been processed by front-end-of-line processes to fabricate one or more integrated circuits that contain device structures and middle-end-of line processes to fabricate a local interconnect structure. The chip may be formed using a wafer of semiconductor material suitable for integrated circuit fabrication.

A layer stack including a capping layer 20 and dielectric layers 22, 24 may be formed on a top surface 14a of dielectric layer 14. The capping layer 20 may be comprised of a material such as $Si_wC_xN_yH_z$, and the dielectric layers may be comprised of silicon nitride ($Si_3N_4$) and silicon dioxide ($SiO_2$).

The layer stack may be patterned to define a via opening 26 and a crackstop opening 28 in the dielectric layers 12, 14. To that end, a mask layer may be applied on the top surface of dielectric layer 24 and lithographically patterned with photolithography process to define openings coinciding with the intended locations of openings 26, 28. The mask layer may comprise a light-sensitive material, such as a photoresist, that is applied as a coating by a spin coating process, pre-baked, exposed to light projected through a photomask, baked after exposure, and developed with a chemical developer to form an etch mask that includes the openings. The pattern of openings in the mask layer is transferred by the etching process from the mask layer to the dielectric layers 12, 14. The etching process may comprise a wet chemical etching process or a dry etching process, such as reactive-ion etching (RIE). The etching process, which may be conducted in a single etching step or multiple steps, relies on one or more etch chemistries to etch the materials of dielectric layers 12, 14 while substantially not etching the dielectric material of the capping layer 20 acting as an etch stop. The mask layer is removed after the openings 26, 28 are formed (e.g., by ashing or solvent stripping if the mask layer is comprised of photoresist), followed by a cleaning process.

A patterned passivation layer 30 is formed that includes a via opening 32 and a crackstop opening 34. The passivation layer 30 may be comprised of an organic material, such as a polymer, that is optionally photosensitive and that is an electrical insulator. The passivation layer 30 may be comprised of photosensitive polyimide (PSPI) or another organic material such as photosensitive polybenzoxazole (PBO). The passivation layer 30 may be prepared by dissolving the polymer in a solvent to form a precursor, spreading the precursor with a spin coating process as a coating across dielectric layer 24, and then drying the coating to remove solvents.

The via opening 32 extends through the entire layer thickness of the passivation layer 30 at the location of via opening 26. The via opening 32 may be considered to be an extension of via opening 26 and to therefore be continuous with via opening 26 so that a single composite via opening extends from the top surface 30a to the metal line 16. The via openings 26, 32 may have the same nominal lateral dimensions (e.g., the same width). The location of the via openings 26, 32 defines an intended position for forming a solder bump connection, and spatially coincides with the location of opening 26 in the dielectric layers 12, 14.

The crackstop opening 34 extends through the entire layer thickness of the passivation layer 30 at the location of the crackstop opening 28. The crackstop opening 34 may be considered to be an extension of crackstop opening 28 and to therefore be continuous with crackstop opening 28 so that a single composite crackstop opening extends from the top surface 30a to the uppermost feature of the metal features 18. The crackstop opening 34 may have larger dimensions (e.g., a larger width) than the crackstop opening 28. The location of the crackstop openings 28, 34 defines an intended position for a crackstop that serves as a barrier for the propagation of cracks inward from an outer edge of the die or a kerf region as might occur, for example, during dicing.

If the passivation layer 30 is comprised of a photosensitive material, the passivation layer 30 may be lithographically patterned by radiation exposure and exposure to a wet chemical developer to define the openings 32, 34. The precursor coating is subsequently cured to imidize and crosslink the polymer. If the passivation layer 30 is comprised of a non-photosensitive material, a photoresist may be spun onto the passivation layer 30, exposed using radiation projected through a photomask, and then developed to form windows at the intended locations for the openings 32, 34. Using the patterned photoresist as an etch mask, the openings 32, 34 may be formed in the passivation layer 30 with a wet chemical etch process.

The capping layer 20 is removed from within the openings 26, 28. The removal of the capping layer 20 can be performed, for example, using a sputter etch with energetic noble gas ions (e.g., positively-charged argon ions) or a RIE. The passivation layer 30 may be cleaned, for example, using a chromic-phosphoric acid solution.

Figure 2:
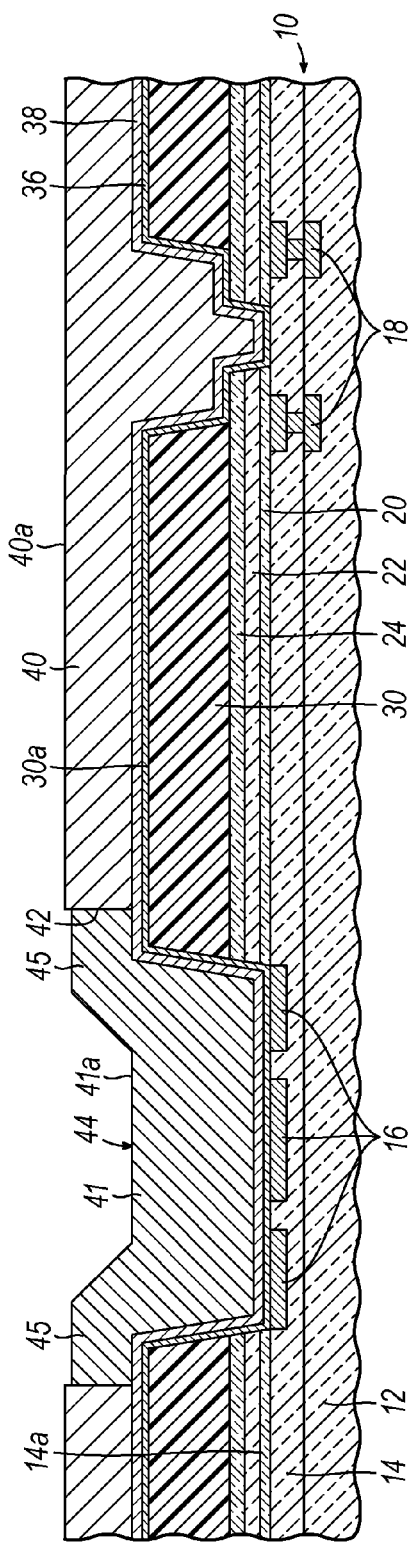

With reference to FIG. 2 in which like reference numerals refer to like features in FIG. 1 and at a subsequent fabrication stage, a layer stack including an adhesion layer 36 and a seed layer 38 is formed that covers the sidewalls of the aligned set of openings 26, 32 and the metal line 16, that covers the sidewalls of the aligned set of openings 28, 34 and the stepped profile at the base created by the larger size of opening 34, and on the passivation layer 30. The adhesion layer 36 may directly contact the seed layer 38 so that layers 36, 38 are in physical and electrical contact. The adhesion layer 36 is in physical and electrical contact with the metal line 16 and with the metal features 18, and may also act as a diffusion barrier in addition to promoting the adhesion of the seed layer 38 with the passivation layer 30 and/or the metal line 16.

The adhesion layer 36 may be comprised of titanium (Ti), titanium nitride (TiN), tantalum (Ta), tantalum nitride (TaN), or a multilayer combination of these materials (e.g., a bilayer of TaN/Ta). In one embodiment, seed layer 38 may be comprised of copper (Cu), such as elemental Cu or co-deposited chromium-copper (Cr—Cu). The adhesion layer 36 and the seed layer 38 may each have a thickness in a range of 10 nm to 100 nm. The layers 36, 38 of the layer stack may be serially deposited using, for example, physical vapor deposition (PVD).

A patterned plating mask 40 is formed by applying a resist layer, exposing the resist layer to radiation through a photomask, and developing the exposed resist layer to form an opening 42 at the location that spatially coincides with the aligned set of via openings 26, 32 reaching to the metal line 16, but that has larger dimensions than via opening 32. A portion of the plating mask 40 fills the aligned set of crackstop openings 28, 34.

A conductive layer 44 is formed that fills and adopts the geometrical shape of the aligned set of openings 26, 32, 42. The conductive layer 44 may be comprised of Cu, although other suitable low-resistivity metals and metal alloys may be selected. The conductive layer 44 may be deposited by a deposition process that does not generate an overburden of conductor on the top surface 40a of the plating mask 40, such as an electrochemical plating process like electroplating. The selective deposition process contrasts with other non-selective deposition processes, such as PVD, that are capable of producing a thick conductor overburden on the top surface 40a. In an electrochemical plating process, the exposed seed layer 38 inside the aligned set of openings 26, 32, 42 operates as a catalyst to nucleate the formation of the conductor constituting conductive layer 44. The layers 36, 38 may cover the entire surface of the wafer, which provides a good conduction path for electroplating currents. The material in seed layer 38 may be subsumed during the deposition process, such that the seed layer 38 may become continuous with or blend into conductive layer 44.

The plating mask 40 covers the seed layer 38 in field regions outside of the vicinity of the opening 42 so that the seed layer 38 cannot initiate conductor growth in the field. The deposition of the conductive layer 44 is also constrained by the dimensions of the openings 26, 32, 42 and the top surface 40a of the plating mask 40 is free of the conductor. A plug 41 comprised of the conductor of conductive layer 44 resides inside the aligned set of openings 26, 32, 42 and may be considered to constitute a component of the under-bump metallurgy. The plug 41 in is direct physical and electrical contact with the top surface 38a of the seed layer 38 inside the aligned set of openings 26, 32, 42. Alternatively, if the seed layer 38 is considered to be subsumed into the material of the plug 41, the plug 41 and the adhesion layer 36 may be considered to be in physical and electrical contact inside the aligned set of openings 26, 32, 42.

The conductive layer 44 may be deposited with a thickness that is greater than or equal to the thickness of the passivation layer 30. A typical thickness for the conductive layer 44 may be greater than or equal to 4 microns, which is at least an order of magnitude thicker than the seed layer 38 and/or the adhesion layer 36. The excess conductor thickness is needed so that the plug 41 can be fully planarized (i.e., lacks a topographical depression or divot after planarization). Full planarization of the plug 41 may minimize Chip-Package-Interaction (CPI)-induced risks, such as a risk of delamination, that might otherwise cause reliability concerns during flip-chip assembly processes. Because the opening 42 in plating mask 40 is larger in size than the opening 32 in passivation layer 30, sections 45 of the conductive layer 44 are joined with the edges of the plug 41 and project above the top surface 30a of passivation layer 30. The sections 45 of the conductive layer 44 in the space between the mask opening 32 and mask opening 42 also partially overlap with the top surface 30a of the passivation layer 30.

With reference to FIG. 3 in which like reference numerals refer to like features in FIG. 2 and at a subsequent fabrication stage, the plating mask 40 is stripped or otherwise removed from the top surface 30a of the passivation layer 30. The field surrounding the aligned set of openings 26, 32, 42 is free of the conductor from the conductive layer 44 other than the minor overlap of the sections 45. However, the plug 41 and the sections 45 of conductive layer 44 adjoining plug 45 project above the top surface 30a of the passivation layer 30 to generate a divoted topography.

With reference to FIG. 4 in which like reference numerals refer to like features in FIG. 3 and at a subsequent fabrication stage, a polishing process is used to planarize the plug 41 relative to the top surface 30a of the passivation layer 30. At the conclusion of the polishing process, the top surface 41a of the plug 41 is coplanar with the top surface 30a of the passivation layer 30. In one embodiment, a chemical-mechanical polishing (CMP) process may be used to remove surface topography and provide the flattening. The CMP process combines abrasion and chemical erosion to remove the peripheral sections 45 and to reduce the thickness of the plug 41. This polishing process or a different polishing process may be used to remove the adhesion layer 36 and seed layer 38 from the top surface 30a of the passivation layer 30. At the conclusion of the polishing, the top surface 30a of the passivation layer 30 is visible.

The polishing process is controlled to eliminate or limit contact of the polish pad with the top surface 30a of the passivation layer 30. The eliminated or limited contact limits the amount of surface damage (features such as scratches and gouges) and other defects created in top surface 30a. The top surface 30a may be considered to be free of surface damage or free of surface damage within a small tolerance for a minor amount of surface damage. The avoided or reduced damage to the top surface 30a may improve its visual appearance by reducing defect introduction and improve the interfacial reliability with contacting packaging materials, like underfill. The reduction in surface damage may also reduce the amount of metal (e.g., the materials comprising the conductive layer 40 and the adhesion layer 36) embedded in the surface features comprising the damage.

The extent of the potential damage is related to the polishing process time beyond the nominal point of surface clearance (i.e., over-polishing beyond the "endpoint") to provide the planarization. A factor influencing this over-polish time beyond endpoint is the thickness of the conductive layer 44 deposited on the top surface 30a of the passivation layer 30. As mentioned previously, the layer thickness is chosen to ensure the plug 41 can be fully planarized. The over-polish time required to adequately clear the surface of the conductor overburden increases with increasing conductor thickness, which increases the contact between the polishing pad and the top surface 30a. The use of patterned plating involving the plating mask 40 and a deposition process that selectively forms the conductive layer 44 without depositing conductor on the top surface 40a of the plating mask 40 in the field surrounding the via opening 42 reduces the overburden requirement of conductor to be removed. The extent of the conductor overburden is limited to conductor in the space between the via openings 32, 42. As a result, the polishing process may reach the endpoint comparatively quickly, and the amount of overpolish can be reduced due to the almost complete absence of conductor overburden. The only sources of overburden in the field are the adhesion layer 36 and the seed layer 38, each of which is thin in comparison with the conductive layer 44. The reduction in the over-polish time may also improve the thickness uniformity of the passivation layer 30, and reduce notching at the junction between the passivation layer 30 and the adhesion layer 36 at the intersection of the via opening 32 with the top surface 30a of the passivation layer 30.

The top surface 30a of passivation layer 30 and the top surface 41a of plug 41 may be cleaned. For example, the top surfaces 30a, 41a may be sputter cleaned using energetic positive argon ions.

A layer stack including an adhesion layer 46 and a seed layer 48 is formed that covers top surface 30a of passivation layer 30 and the top surface 41a of plug 41, and that covers the sidewalls of the aligned set of openings 28, 34 and the stepped profile at the base created by the larger size of opening 34. The adhesion layer 46 may directly contact the seed layer 48 so that layers 46, 48 are in physical and electrical contact. The layers 46, 48 are components of Ball Limiting Metallurgy (BLM) or Under Bump Metallurgy (UBM). The adhesion layer 46 may be comprised of one or more refractory metals that are thermally stable during BEOL processes and that strongly adhere with the subsequently-formed pedestal. The adhesion layer 46 may be comprised of, for example, titanium tungsten (TiW), and the seed layer 48 may be comprised of Cu or Cr—Cu. Layers 46, 48 of the layer stack may be serially deposited using, for example, PVD.

With reference to FIG. 5 in which like reference numerals refer to like features in FIG. 4 and at a subsequent fabrication stage, a patterned plating mask 50 is formed by applying a layer of a photo-sensitive organic material, exposing the photosensitive organic material in the layer to radiation through a photomask, and developing the exposed photosensitive organic material to form an opening 52 in the layer at a location that spatially coincides with the plug 41. In one embodiment, the plating mask 50 may be a photoactive polymer resist, such as RISTON® photopolymer resist. The plating mask 50 fills the aligned set of openings 28, 34 and the opening 52 determines the shape, thickness, and location of a pedestal and solder bump. The dimensions of the opening 52 in the plating mask 50 may match a specification for solder bumping and, in particular, may match the specification for C4 solder bumping. In particular, the size of the opening 52 is a factor in determining dimensions (length and width) of the pedestal and solder bump and the thickness of the plating mask 50 is a factor in determining the height of the pedestal and solder bump.

A pedestal comprised of barrier layers 54, 58 and a conductor layer 56 disposed between the barrier layers 54, 58 is formed within the opening 52 in the plating mask 50. The barrier layer 54 may be formed on a top surface of the seed layer 48 overlying the plug 41. The conductor layer 56, which is comprised of a different material, such as Cu, is formed on a top surface of the barrier layer 54. The barrier layer 58 may be formed on a top surface of the conductor layer 56. The barrier layers 54, 58 and conductor layer 56 do not form on the plating mask 50. In a representative embodiment, the barrier layers 54, 58 may be comprised of a metal, such as nickel (Ni) or a Ni alloy (e.g., NiCo), deposited by an electrochemical plating process (e.g., electroplating). Similarly, the conductor layer 56 may also be deposited by an electrochemical plating process, such as electroplating.

A solder bump 60 is formed on the top surface 58a of the barrier layer 58. The solder bump 60 may be comprised of solder having a conventional lead-free (Pb-free) composition, which may include tin (Sn) as the primary elemental component. In a representative embodiment, the solder bump 60 may be formed by electroplating using an appropriate plating solution, anodes, and direct current. The barrier layers 54, 58, conductor layer 56, plug 41, adhesion layer 46, and adhesion layer 36 provide a conductive path between the metal line 16 and the solder bump 60. The barrier layer 58 may protect the material (e.g., Cu) of the underlying plug 41 against consumption during reflow processes from reactions with the solder bump 60.

With reference to FIG. 6 in which like reference numerals refer to like features in FIG. 5 and at a subsequent fabrication stage, the plating mask 50 is stripped or otherwise removed from the top surface of the seed layer 48. For example, a stripping solution may be used if the plating mask 50 is comprised of a photoactive polymer resist, such as RIS-TON®. A solder bump connection 64 is defined by the structures between the metal line 16 and the solder bump 60.

Field regions of the adhesion layer 46 and seed layer 48 are removed from the areas of the top surface 30a of passivation layer 30 that are not covered by the solder bump connection 64. Seed layer 38 is also removed from within crackstop opening 30 by an etching process that is selective to the adhesion layer 36. The field regions of the adhesion layer 36 may be removed using wet chemical etching processes with the aligned set of crackstop openings 28, 34 masked so that the adhesion layer 36 is retained inside the crackstop openings 28, 34. During BEOL processing, the solder bump connection 64 is replicated across at least a portion of the surface area of the wafer.

The solder bump 60 is reflowed and a flip-chip assembly process may thereafter be performed. The chip carrying the solder bump connection 64 is inverted and aligned relative to a laminate substrate. The solder bumps, including solder bump 60, are bonded to the matching pads on the laminate substrate using a reflow process. The temperature of the reflow process is dependent upon solder composition but is typically in a range of 200° C. to 300° C. Eventually, the solder bump 60 and solder bump connection 64 generate an electrical pathway for transferring data signals to and from the chip to an external device, such as a computing system, or an electrical pathway for powering integrated circuits on the chip.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. The chip may be integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

A feature may be "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of fabricating a solder bump connection, the method comprising:
   forming a passivation layer on a dielectric layer;
   forming a via opening extending through the passivation layer from a top surface of the passivation layer to a metal line in the dielectric layer;
   forming a seed layer covering the via opening, the metal line, and the top surface of the passivation layer;
   after the seed layer is formed, forming a mask on the top surface of the passivation layer and having a mask opening aligned with the via opening;
   selectively forming a conductive layer in the via opening and the mask opening that projects above the top surface of the passivation layer; and
   planarizing the passivation layer and the conductive layer to define a plug in the via opening that is coupled with the metal line,
   wherein the seed layer is configured to promote formation of a conductor that comprises the conductive layer, the mask opening is larger than the via opening, and seed layer is exposed within the mask opening and the via opening.

2. The method of claim 1 wherein the mask covers the seed layer on the top surface of the passivation layer outside of the mask opening when the conductive layer is selectively formed in the via opening and the mask opening.

3. The method of claim 2 further comprising:
   before the seed layer is formed, forming an adhesion layer covering the via opening, the metal line, and the top surface of the passivation layer.

4. The method of claim 3 wherein the conductive layer includes sections that overlap the top surface of the passivation layer within the mask opening, and planarizing the passivation layer and the conductive layer comprises:
   removing the sections of the conductive layer that project above the top surface of the passivation layer; and
   removing the seed layer and the adhesion layer from the top surface of the passivation layer.

5. The method of claim 2 wherein selectively forming the conductive layer in the via opening and the mask opening comprises:
   electrodepositing the conductive layer on the seed layer exposed within the mask opening and the via opening.

6. The method of claim 1 wherein the crackstop opening and the via opening are concurrently formed in the passivation layer, and further comprising:
   forming a passivation layer on a dielectric layer;
   forming a via opening extending though the passivation layer from a top surface of the passivation layer to a metal line in the dielectric layer;

forming a crackstop opening extending though the passivation layer;

forming a mask on the top surface of the passivation layer and having a mask opening aligned with the via opening;

forming a seed layer covering the crackstop opening, the via opening, the metal line, and the top surface of the passivation layer after the seed layer is formed, selectively forming a conductive later in the via opening and the mask opening that projects above the top surface of the passivation layer; and planarizing the passivation layer and the conductive layer to define a plug in the via opening that is coupled with the metal line, wherein the seed layer is configured to promote formation of a conductor that comprises the conductive layer.

7. The method of claim 6 wherein the mask covers the seed layer on the passivation layer and the seed layer in the crackstop opening when the conductive layer is selectively formed in the via opening and the mask opening, and further comprising:

after the conductive layer is selectively formed in the via opening, removing the seed layer from the crackstop opening.

8. The method of claim 1 further comprising:

before the passivation layer and the conductive layer are planarized, removing the mask from the top surface of the passivation layer.

9. The method of claim 1 further comprising:

forming a solder bump that is coupled with the metal line by the plug.

10. The method of claim 1 wherein selectively forming the conductive layer in the via opening and the mask opening comprises:

depositing the conductive layer only within the via opening and the mask opening.

11. The method of claim 1 wherein selectively forming the conductive layer in the via opening and the mask opening comprises:

electrodepositing a conductor within the via opening and the mask opening to selectively form the conductive layer.

12. The method of claim 11 wherein the conductive layer has a first thickness greater than a second thickness of the passivation layer before the passivation layer and the conductive layer are planarized.

13. The method of claim 12 wherein planarizing the passivation layer and the conductive layer comprises:

chemical-mechanical polishing the passivation layer and the conductive layer to reduce the first thickness of the conductive layer to be equal to the second thickness of the passivation layer and to remove sections of the conductive layer that overlap the top surface of the passivation layer within the mask opening.

14. The method of claim 1 wherein the passivation layer is comprised of an organic material, and planarizing the passivation layer and the conductive layer comprises:

chemical-mechanical polishing the passivation layer and the plug, wherein the organic material of the passivation layer is free of surface damage after the passivation layer and the conductive layer are planarized.

15. A method of fabricating a solder bump connection, the method comprising:

forming a passivation layer on a dielectic layer;

forming a via opening extending through the passivation layer from a top surface of the passivation layer to a metal line in the dielectric layer;

forming a seed layer covering the via opening, the metal line, and top surface of the passivation layer;

after the seed layer is formed, forming a mask on the top surface of the passivation layer and having a mask opening aligned with the via opening;

selectively forming a conductive layer in the via opening and the mask opening that projects above the top surface of the passivation layer; and planarizing the passivation layer and the conductive layer to define a plug in the via opening that is coupled with the metal line, wherein the seed layer is configured to promote formation of a conductor that comprises the conductive layer, and the seed layer is exposed within the mask opening and the via opening.

16. The method of claim 15 wherein the mask covers the seed layer on the top surface of the passivation layer outside of the mask opening when the conductive layer is selectively formed in the via opening and the mask opening.

17. The method of claim 16 further comprising:

before the seed layer is formed, forming an adhesion layer covering the via opening, the metal line, and top surface of the passivation layer.

18. The method of claim 17 wherein the conductive layer includes sections that overlap the top surface of the passivation layer within the mask opening, and planarizing the passivation layer and the conductive layer comprises:

removing the sections of the conductive layer that project above the top surface of the passivation layer; and removing the seed layer and the adhesion layer from the top surface of the passivation layer.

19. The method of claim 16 wherein selectively forming the conductive layer in the via opening and the mask opening comprises:

electrodepositing the conductive layer on the seed layer exposed within the mask opening and the via opening.

20. The method of claim 15 further comprising:

before the passivation layer and the conductive layer are planarized, removing the mask from the top surface of the passivation layer.

* * * * *

UNITED STATES PATENT AND TRADEMARK OFFICE
CERTIFICATE OF CORRECTION

| | | |
|---|---|---|
| PATENT NO. | : 9,159,696 B2 | Page 1 of 1 |
| APPLICATION NO. | : 14/026158 | |
| DATED | : October 13, 2015 | |
| INVENTOR(S) | : Timothy H. Daubenspeck et al. | |

It is certified that error appears in the above-identified patent and that said Letters Patent is hereby corrected as shown below:

In the claims,

Column 8, line 37, after "and" insert --the--

Column 10, line 15, after "and" insert --the--

Signed and Sealed this
Eighth Day of March, 2016

Michelle K. Lee
*Director of the United States Patent and Trademark Office*